US007889020B2

(12) United States Patent
Hock et al.

(10) Patent No.: US 7,889,020 B2
(45) Date of Patent: Feb. 15, 2011

(54) ASYMMETRICAL FILTER

(75) Inventors: Joseph M. Hock, Surfside Beach, SC (US); John L. Galvagni, Surfside Beach, SC (US)

(73) Assignee: AVX Corporation, Myrtle Beach, SC (US)

( * ) Notice: Subject to any disclaimer, the term of this patent is extended or adjusted under 35 U.S.C. 154(b) by 1087 days.

(21) Appl. No.: 11/583,361

(22) Filed: Oct. 18, 2006

(65) Prior Publication Data

US 2007/0085630 A1 Apr. 19, 2007

Related U.S. Application Data

(60) Provisional application No. 60/728,263, filed on Oct. 19, 2005.

(51) Int. Cl.
*H04B 3/30* (2006.01)
*H03H 7/00* (2006.01)

(52) U.S. Cl. .......................... 333/12; 333/172; 333/182

(58) Field of Classification Search .................. 333/12, 333/172, 182; 607/36, 37; 361/302
See application file for complete search history.

(56) References Cited

U.S. PATENT DOCUMENTS

| 5,896,267 | A | 4/1999 | Hittman et al. |
| 5,999,398 | A | 12/1999 | Makl et al. |
| 6,424,234 | B1 | 7/2002 | Stevenson |
| 6,459,935 | B1 | 10/2002 | Piersma |
| 6,765,780 | B2* | 7/2004 | Brendel et al. ............... 361/302 |
| 6,795,730 | B2 | 9/2004 | Connelly et al. |
| 7,363,090 | B2* | 4/2008 | Halperin et al. ............. 607/116 |
| 2004/0263174 | A1 | 12/2004 | Gray et al. |
| 2005/0197677 | A1 | 9/2005 | Stevenson |
| 2007/0083244 | A1* | 4/2007 | Stevenson et al. ............. 607/37 |
| 2009/0259265 | A1* | 10/2009 | Stevenson et al. ............. 607/2 |

OTHER PUBLICATIONS

Interview by Jodie Miller in EPlab Digest, "Advances in MRI-Safe Technology: Interview with Michael L. Weiner, CEO, Biophan Technologies, Inc.", Jul. 2004.
Maria Fontanazza for MDDI R&D Digest, "Heart Devices May Be Safe for MRI Scan", Oct. 2004.
Philip E. Rossurl for American College of Radiology, Spectrum Online, "New Pacemakers Prove MRI-Proof", Oct. 2004.

* cited by examiner

*Primary Examiner*—Robert Pascal
*Assistant Examiner*—Kimberly E Glenn
(74) *Attorney, Agent, or Firm*—Dority & Manning, P.A.

(57) ABSTRACT

Disclosed is methodology and apparatus for producing an asymmetrical filter for use with implantable medical devices, and in other input filtering environments. Differing forward and reverse characteristic responses are provided by inserting a low value resistor in series with heart connecting leads so that EMI input protection may be provided without significantly reducing energy transfer from the protected device. Improved protection against voltage transients is provided with present arrangements of differentiated series impedance. Higher frequency energy is allowed out of a subject device than is allowed into such device, which allows for attenuation of undesired frequency ranges entering the filter while allowing output pulses to exit without distortion.

21 Claims, 4 Drawing Sheets

ASYMMETRICAL FILTER

PRIORITY CLAIM

This application claims the benefit of previously filed U.S. Provisional Patent Application entitled "ASYMMETRICAL FILTER" and assigned U.S. Ser. No. 60/728,263, filed Oct. 19, 2005, and which is incorporated herein by reference for all purposes.

FIELD OF THE INVENTION

The presently disclosed technology relates to the provision of filters and their applications to device input and output filtering. The present technology has particular applicability to implantable medical devices.

BACKGROUND OF THE INVENTION

Heart pacemakers and other implantable medical devices are constructed having an outer housing within which the necessary electronic components are contained. Such outer housing must be formed of a material which is compatible with being placed inside the human body. It is also generally desirable to shield the electronics within such housing from external sources of electromagnetic interference (EMI). Titanium is often utilized to satisfy such dual requirements of biocompatibility and shielding.

At least one elongate lead (i.e., a wire) will generally extend from the electronics within such an outer housing to a desired location inside a user's body. While the outer housing may shield the internal electronics from direct EMI radiation, steps may also be taken to inhibit transmission of EMI along such elongated lead itself. For example, selected capacitive and/or inductive components may be mounted on a circuit board along with the other internal electronics in order to provide EMI filtering. Alternatively, a so-called feed-through style filter may be provided at the location where the elongated lead passes through the outer housing. Examples of such feed-through filter subject matter are shown and described in U.S. Pat. Nos. 5,999,398, and 6,459,935 B1, both assigned to the owner of the present subject matter, and the disclosures of which patents are fully incorporated herein by reference, for all purposes.

U.S. Pat. No. 5,999,398 to Makl et al. entitled "FEED-THROUGH FILTER ASSEMBLY HAVING VARISTOR AND CAPACITOR STRUCTURE" describes a feed-through filter assembly such as may be used in an implantable medical device. The assembly includes a conductive mounting element which may be hermetically sealed to an outer housing of the implantable medical device. In many embodiments, the conductive mounting element will be a conductive canister in which a feed-through filter structure is located. Alternatively, the conductive mounting element may include a suitable sub-plate structure. Because the filter structure exhibits varistor and capacitive characteristics, effective transient suppression and interference filtering is achieved in a single package. Secondary filtering may be provided downstream of the filter assembly for additional interference filtering at lower frequencies.

U.S. Pat. No. 6,459,935 B1 to Piersma entitled "INTEGRATED FILTER FEED-THRU" describes a multi-leaded, filter feed-thru assembly for implantable medical devices, such as heart pacemakers, defibrillators, and neurostimulators, which integrates both multi-element semiconductor devices and passive component devices, or multi-element combinations thereof, together with a discoidal capacitive filter device to provide filtration of electromagnetic interference is provided. The assembly additionally provides for the suppression of high voltage transients from defibrillation and electrocautery procedures, as well as providing additional circuit and network functions.

Although pacemaker signals are relatively low voltage, capacitors utilized in feed-through filtering arrangements must often be constructed to withstand relatively high voltage levels. This is to ensure that the capacitor does not become damaged if subjected to voltage transients, such as those which may be caused by defibrillation pulses. Particular concern is raised if some or all of the same leads used as output from certain implantable medical devices are also used as input leads for associated measurement technology because the energy exiting certain implantable devices may be higher than that entering the devices as input signals.

Additional exemplary information regarding filtering technology may be found in other patents, published patent applications, and publications, including Published U.S. Patent Applications 2005/0197677 A1, entitled "APPARATUS AND PROCESS FOR REDUCING THE SUSCEPTABILITY OF ACTIVE IMPLANTABLE MEDICAL DEVICES TO MEDICAL PROCEDURES SUCH AS MAGNETIC RESONANCE IMAGING" by Stevenson, published Sep. 8, 2005; and 2004/0263174 A1, entitled "MAGNETIC RESONANCE IMAGING INTERFERENCE IMMUNE DEVICE" by Gray et al., published Dec. 30, 2004; and U.S. Pat. No. 6,795,730 B2, entitled "MRI-RESISTANT IMPLANTABLE DEVICE" by Connelly et al.; U.S. Pat. No. 6,424,234 B1, entitled "ELECTROMAGNETIC INTERFERENCE (EMI) FILTER AND PROCESS FOR PROVIDING ELECTROMAGNETIC COMPATIBILITY OF AN ELECTRONIC DEVICE WHILE IN THE PRESENCE OF AN ELECTROMAGNETIC EMITTER OPERATING AT THE SAME FREQUENCY" by Stevenson; U.S. Pat. No. 5,896,267, entitled "SUBSTRATE MOUNTED FILTER FOR FEEDTHROUGH DEVICES" by Hittman et al.; and PUBLICATIONS: "Heart Devices May Be Safe for MRI Scan," R& D Digest, October 2004; "New Pacemakers Prove MRI-Proof," Spectrum Online, Oct. 21, 2004; and "Advances in MRI-Safe Technology: Interview with Michael L. Weiner, CEO, Biophan Technologies, Inc.," EPlab Digest, July 2004.

While various implementations of feedthrough filter assemblies have been developed for use in association with medical implants and other input and/or output filtering applications, no design has emerged that generally encompasses all of the desired characteristics as hereafter presented in accordance with the subject technology.

SUMMARY OF THE INVENTION

The present subject matter recognizes and addresses several of the foregoing issues, and others concerning certain aspects of feedthrough filtering. Thus, broadly speaking, an object of certain embodiments of the presently disclosed technology is to provide an improved design for certain components associated with the implementation of feedthrough filters and, more particularly, with feedthrough filters employable in association with implantable medical devices and other input and/or output filtering related technology.

Aspects of certain exemplary embodiments of the present subject matter relate to the provision of an asymmetrical filtering arrangement capable of passing different energy levels in the respective forward and reverse directions (i.e., having different input versus output characteristics).

Aspects of other exemplary embodiments of the present subject matter provide protective features for a signal input portion of a measuring device while permitting high energy output from the device.

Still further aspects of yet still other embodiments of the present subject matter provide enhancements to feedthrough filtering configurations allowing for improved operation of associated electronic equipment when exposed to external sources of electromagnetic interference (EMI).

Yet further aspects of other embodiments of the present subject matter provide enhancements to feedthrough filtering configurations, for improved protection against voltage transients, and in the context of present arrangements of differentiated series impedance, such that higher frequency energy is allowed out of a subject device than is allowed into such device, which allows for attenuation of undesired frequency ranges entering the filter while allowing output pulses to exit without distortion.

Still further, it is to be understood that the present technology equally applies to the resulting devices and structures disclosed and/or discussed herewith, as well as the corresponding involved methodologies.

In one present exemplary embodiment, a filtered feedthrough capacitor arrangement is provided for use in a patient-implantable medical environment, and may comprise a feedthrough capacitor, a feedthrough filter, and an asymmetrical filter. In such exemplary arrangement, such exemplary feedthrough capacitor may have a main body and at least a first lead emerging from one side of such main body and a second lead emerging from another side of such main body. Such exemplary feedthrough filter may be associated with at least one of said feedthrough capacitor leads; and such exemplary asymmetrical filter may be associated with such at least one of the feedthrough capacitor leads, and electrically situated between such feedthough capacitor and such feedthrough filter. Such asymmetrical filter in such exemplary arrangement may preferably further include a relatively low value resistance for providing differing forward and reverse characteristic responses of the filtered feedthrough capacitor arrangement.

Still further, in various specific arrangements of such exemplary present embodiment, such feedthrough capacitor first and second leads may comprise respective sets of pluralities of leads, while such exemplary asymmetrical filter may comprise a resistor mounting substrate, with a corresponding plurality of relatively low value resistors supported thereon, and associated with one of the respective sets of plural leads of said feedthrough capacitor, each of said resistors having a respective value generally no greater than a predetermined value. In certain of such arrangements, such resistors may each comprise a thick film resistor supported on such asymmetrical filter substrate, and respectively interconnecting with one of such feedthrough capacitor leads and a lead associated with such feedthrough filter. In other, alternative arrangements, such resistors may each comprise one of a plurality of relatively low value, wire wound resistors supported on such substrate.

In yet another present arrangement of a present embodiment, a filter circuit may be provided for use electrically interposed between a feedthrough capacitor and a feedthrough filter of the type having plural respective leads, and provided for use in association with implantable medical devices and other input and/or output filtering related environments. Such exemplary filter circuit may preferably comprise a resistor mounting substrate; and a plurality of predetermined relatively small value resistors supported on such substrate and arranged for connection in series with input or output leads of a further device, collectively providing with an associated feedthrough capacitor and feedthrough filter an asymmetrical filtering arrangement capable of passing different energy levels in respective forward and reverse directions.

Still further present embodiments relate to corresponding methodology, for example such as an exemplary method for improving EMI and voltage transient protection for implantable medical devices, including providing differing forward and reverse characteristic responses thereof by inserting a predetermined relatively low value resistance in series with biocompatible connecting leads of the implantable device, so that EMI input protection may be provided thereto without significantly reducing energy transfer from the protected implantable device.

Additional objects and advantages of the present subject matter are set forth in, or will be apparent to those of ordinary skill in the art from, the detailed description herein. Also, it should be further appreciated by those of ordinary skill in the art that modifications and variations to the specifically illustrated, referenced, and discussed features and/or steps hereof may be practiced in various embodiments and uses of the disclosed technology without departing from the spirit and scope thereof, by virtue of present reference thereto. Such variations may include, but are not limited to, substitution of equivalent means, steps, features, or materials for those shown, referenced, or discussed, and the functional, operational, or positional reversal of various parts, features, steps, or the like.

Still further, it is to be understood that different embodiments, as well as different presently preferred embodiments, of this technology may include various combinations or configurations of presently disclosed steps, features or elements, or their equivalents (including combinations of features or configurations thereof not expressly shown in the figures or stated in the detailed description).

BRIEF DESCRIPTION OF THE DRAWINGS

A full and enabling description of the present subject matter, including the best mode thereof, directed to one of ordinary skill in the art, is set forth in the specification, which makes reference to the appended figures, in which.

Figure 1:
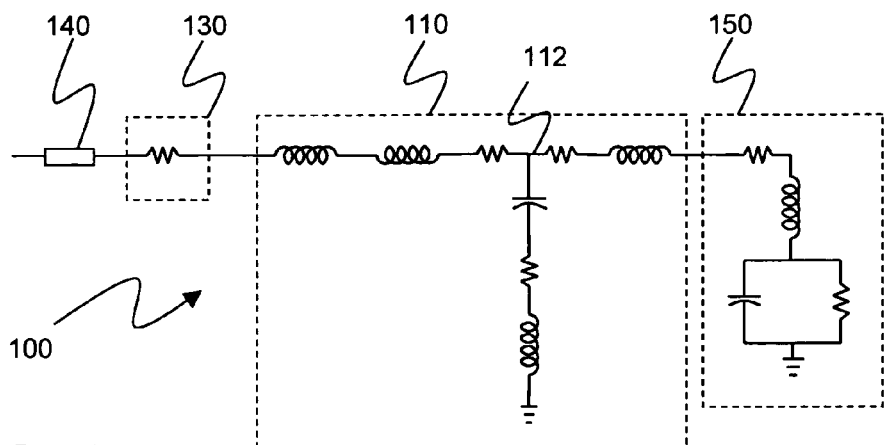
FIG. 1 illustrates a partial schematic diagram and equivalent circuit of an asymmetrical filter associated with an exemplary feedthrough filter in accordance with the present technology.

Repeat use of reference characters throughout the present specification and appended drawings is intended to represent same or analogous features, elements, or steps of the present subject matter.

DETAILED DESCRIPTION OF THE PREFERRED EMBODIMENTS

As discussed in the Summary of the Invention section, the present subject matter is particularly concerned with certain aspects of feedthrough filtering employable in association with implantable medical devices and related technology and methodology. More particularly, the present subject matter is concerned with an improved asymmetrical filter designed to provide differing forward and reverse energy flow characteristics, and is concerned with corresponding methodologies.

Selected combinations of aspects of the disclosed technology correspond to a plurality of different embodiments of the present subject matter. It should be noted that each of the exemplary embodiments presented and discussed herein should not insinuate limitations of the present subject matter. Features or steps illustrated or described as part of one embodiment may be used in combination with aspects of another embodiment to yield yet further embodiments. In additional, certain features may be interchanged with similar devices or features not expressly mentioned which perform the same or similar functions.

Reference will now be made in detail to exemplary presently preferred embodiments involving the subject asymmetrical filter. Referring now to the drawings, FIG. 1 schematically illustrates a partial schematic diagram and equivalent circuit diagram of an exemplary asymmetrical filter generally 100 associated with a feedthrough filter 110 in accordance with the present technology.

Asymmetrical filter 100 may be formed, for example, by inserting a small (that is, low) value resistor 130 in series between heart lead 140 and a filter circuit 110. Filter circuit 110 is coupled between small value resistor 130 and an input terminal of a device schematically represented by equivalent circuit 150. Heart lead 140 may correspond to, or represent, one or more electrical leads coupled directly to a patient's heart for application of, for example, a pacing signal from a pacemaker, as well as for detection of naturally occurring heart related electrical signals.

In the present discussion, reference is made to the use of the asymmetrical filter in accordance with the present subject matter in association with a pacemaker. It should be well understood, however, by those of ordinary skill in the art, that the present subject matter is not so limited, as the disclosed subject matter may be applied in other environments as well. For example, asymmetrical filtering may provide certain advantages when used in association with other medical devices including, for example, heart monitors, defibrillators, and neurostimulators. Asymmetrical filtering as disclosed herein may also be applied in other environments where both high and low level signals may be applied to a common signal transmission medium. Non-exhaustive examples of such include data line transceivers and radio frequency (RF) transceivers.

Figure 2:
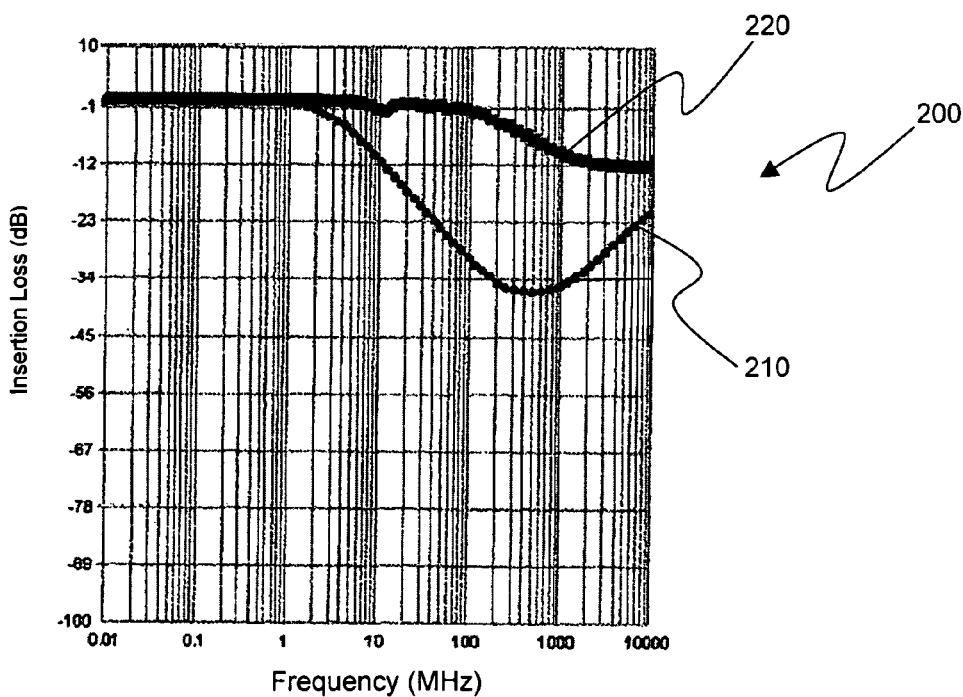
FIG. 2 is a graphical representation of the input and output response of an exemplary asymmetrical filter, such as that of present FIG. 1, constructed in accordance with the present technology.

As illustrated in FIG. 2, it has been found that insertion of a small valued resistor 130 in series between heart lead 140 and filter circuit 110 provides differing filter responses with respect to whether a signal is being applied to the asymmetrical filter and passed to, for example, measuring circuitry or being sent out through the asymmetrical filter and applied to, for example, heart lead 140.

As illustrated in FIG. 2, a pair of response curves 210, 220 illustrate, respectively, the overall input and output responses from an exemplary asymmetrical filter constructed in accordance with the present subject matter. From a review of such response curves 210, 220, it will be appreciated that the input response curve 210 experiences significantly higher insertion loss than the output response curve 220, particularly at frequencies above about 2 MHz. Such asymmetric response provides improved protection from EMI applied to device 150 while at the same time limiting impact on any output signal from device 150. In this exemplary embodiment of the present subject matter, the small value resistor 130 had a value of 15 ohms.

Also, in such exemplary embodiment, the resistance, capacitance, and inductance values within representative filter circuit 110 may be practiced as follows. Variations may also be practiced, for specific embodiments in accordance with the present subject matter. The represented initial inductance value may be 0.1 nH, while the inductance represented on either side of node 112 may each be 0.083 nH, while the inductance going to ground (beneath node 112) may be 0.028 nH. The exemplary resistance in such ground leg may be about 0.229 ohms, while the resistance on either side of node 112 may be 0.2 ohms. The exemplary capacitance in the ground leg below node 112 may be 3553.407 pF.

Figure 3:
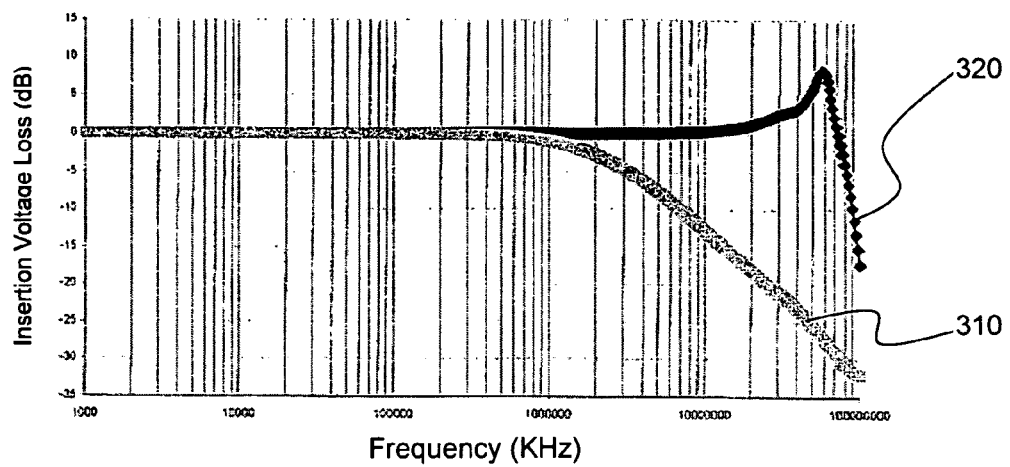
FIG. 3 is a graphical representation of the forward and reverse insertion voltage loss of an exemplary asymmetrical filter, such as that of present FIG. 1, constructed in accordance with the present technology.

With reference now to FIG. 3, representative response curves are illustrated for a further exemplary embodiment of an asymmetrical filter constructed in accordance with the present subject matter. In the embodiment represented by FIG. 3, the small value resistor 130 (FIG. 1) had a value of 20 ohms. In this exemplary embodiment, the forward measurement (representative response curve 310) exhibits a significantly higher insertion loss than the reverse measurement (representative response curve 320), particularly at frequencies above about 2 MHz, in a manner similar to that illustrated in FIG. 2. Response curves such as shown in FIG. 3 in conjunction with a small value resistor 130 value of 20 ohms are the results of measurements made in a gain phase mode, with a 1 M ohm input impedance, as will be well understood by those of ordinary skill in the art.

Figures 4A, 4B:
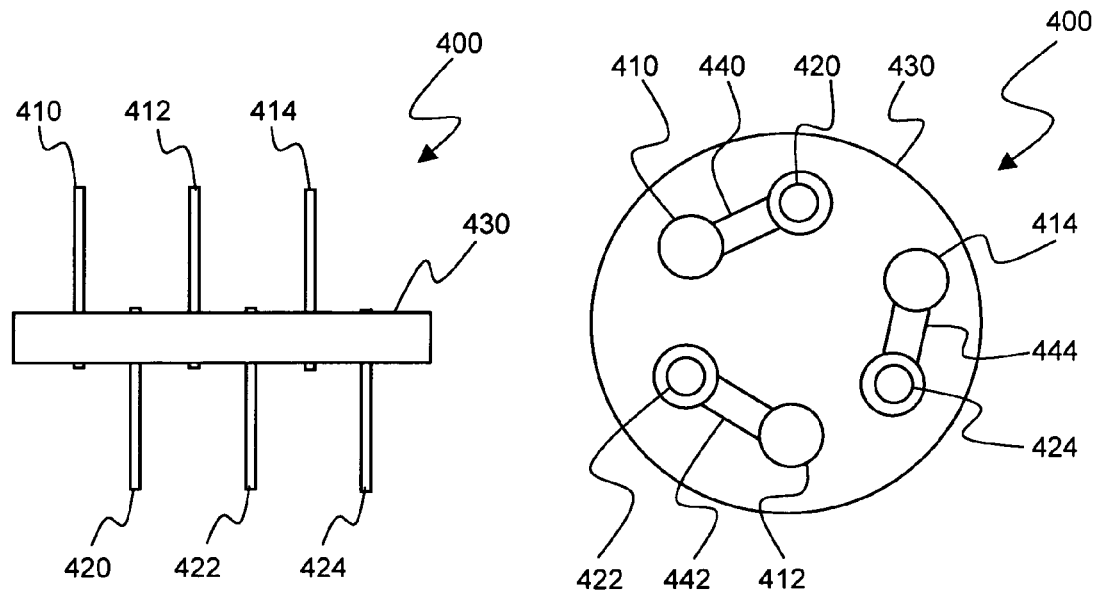
FIGS. 4(a) and 4(b) are respectively side elevation and top plan views of a first embodiment of an exemplary present resistor configuration for use with an exemplary asymmetrical filter constructed in accordance with the present technology.

With reference now to FIGS. 4(a) and 4(b), there are illustrated side elevation and top plan views of an exemplary embodiment of a present resistor mounting substrate generally 400 as may be used to support a plurality of small value resistors 440, 442, 444 for connection in series with input/output leads of an implantable medical device, for example, a pacemaker.

In the illustrated exemplary embodiment, resistor mounting substrate 400 may correspond to a ceramic substrate 430 on which are mounted a number of thick film resistors 440, 442, 444 such that the resistors are coupled to respective connection pin pairs 410/420; 412/422; and 414/424. Such present exemplary resistor mounting substrate 400 may be coupled, in some instances, to known feedthrough capacitor structures, as will be more fully illustrated and discussed with reference to FIG. 7.

Figure 5:
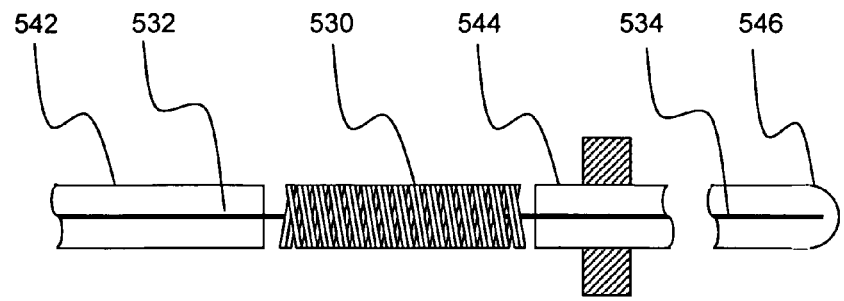
FIG. 5 is a partially exploded view of a second embodiment of an exemplary present resistor configuration for use with an exemplary asymmetrical filter constructed in accordance with the present technology.
Figures 6A, 6B:
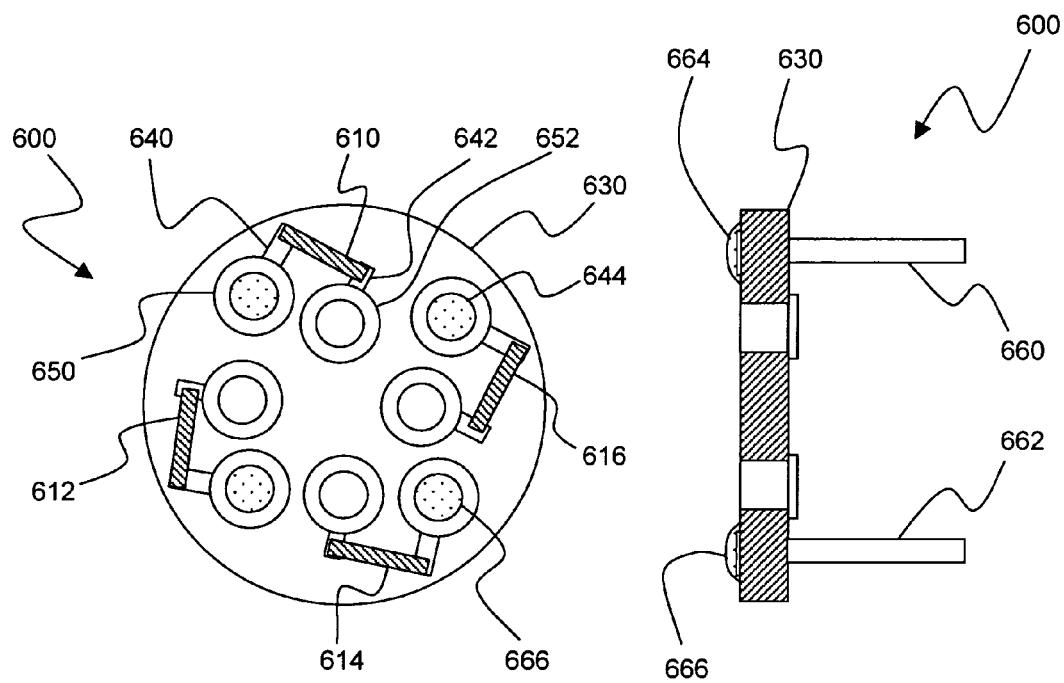
FIGS. 6(a) and 6(b), respectively, are top plan and side cross section views of a second exemplary embodiment of a present resistor configuration for use with an exemplary asymmetrical filter constructed in accordance with the present technology.

With reference now to FIGS. 5, 6(a) and 6(b), a further exemplary embodiment of a present resistor mounting substrate generally 600 in accordance with the present subject matter. First with reference to FIG. 5, there is illustrated a second exemplary embodiment of a resistor usable as the small value resistor 130 (FIG. 1) to produce an asymmetrical filtering response. In this exemplary embodiment, resistor 530 corresponds to a wound wire resistor and is configured such that respective end portions generally 532 and 534 of the wound wire are inserted into respective conductive termination tubes 542 and 544. In an exemplary configuration, wire wound resistor 530 may correspond to about 42 turns of nichrome wire (3 mil coated resistor wire, non-magnetic) wound around a 15 mil mandrel to produce a resistance value of about 15 ohms. With such exemplary values, the resulting coil would be expected to be about 120 mils long. Conductive termination tubes 542 and 544 may correspond to Platinum/Rhodium (Pt/Rh) tubes, for example, with about 12 mil outside diameters and 4 mil inside diameters, while the end portion 534 of the wound wire may be gas tungsten arc (TIG) welded onto end 546 so as to form a hermetic and positive joint.

Referring now to FIGS. 6(a) and 6(b), there are illustrated top plan and side cross section views of a second embodiment of a resistor mounting substrate generally 600 in accordance with the present subject matter. As may more readily be seen in FIG. 6(a), a plurality of wire wound resistors 610, 612, 614, and 616 are mounted on support substrate 630 and coupled by way of lands 640, 642, away from fillets 650, 652. Solderable wires 660, 662 (shown in FIG. 6(b)) may be soldered to selected fillets as at solder locations 664, 666 to provide connection to a feedthrough capacitor structure, such as will be described with reference to FIG. 7. Support substrate 630 may correspond to a ceramic substrate, although it is to be strictly understood that any other suitable support structure material may be employed.

Figure 7:
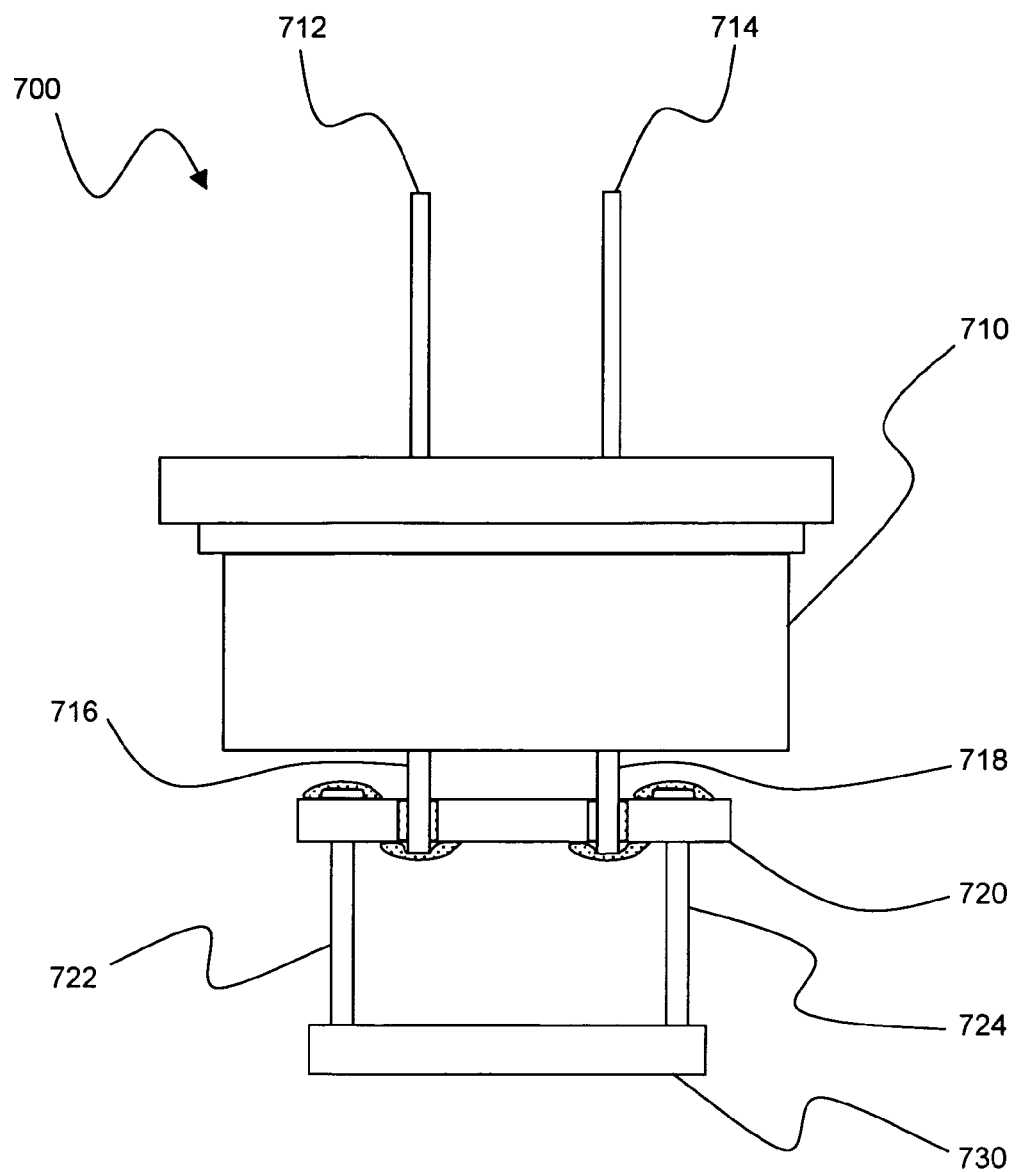
FIG. 7 is a side elevation view (with partial cutaway illustrations) of an exemplary present resistor configuration combined with an exemplary feedthrough capacitor in accordance with the present technology.

With reference now to FIG. 7, an exemplary assembly generally 700 of an exemplary asymmetrical filter in accordance with the present subject matter will be described. As illustrated per this embodiment, a known feedthrough capacitor structure generally 710 is provided with leads 712, 714, 716, and 718 that may, in fact, correspond in number to more or less than the number of leads presently illustrated. The specific structure of the representative feedthrough capacitor is not a limitation of the present subject matter, but as an example only, such structure may generally correspond to that illustrated in U.S. Pat. Nos. 5,999,398 and 6,459,935 B1, referenced above.

An exemplary asymmetry circuit board 720 constructed in accordance with the previously described exemplary configurations may be mounted to feedthrough capacitor 710 leads 716, 718 such that the asymmetry circuit board 720, by way of associated resistors (like resistor arrangements or equivalent thereto per other present figures but not separately shown in FIG. 7), may provide a mechanism for inserting a small value resistor in series with the feedthrough capacitor leads. Low thermal conductivity leads 722, 724 soldered to fillets on asymmetry circuit board 720 provide a connection pathway to a standard filter assembly 730, for example, such as filter 110 schematically illustrated in FIG. 1.

In the instance of the example of present FIG. 7, low thermal conductivity leads 722 and 724 may have a thermal conductivity rating of less than 8 British thermal unit$_{IT}$ per hour foot degree Fahrenheit (i.e., BTU/hrftF). Such leads 722 and 724 may comprise, for example, Inconel, Titanium or Zirconium alloys, to allow laser welding or other forms of heat treatment for welding without causing significant heat transfer to any circuitry, such as on exemplary circuit board 720. By contrast, in such exemplary embodiment, the thermal conductivity of the leads 712 and 714 may be above 42 BTU/hrftF, and such leads may comprise Platinum or an equivalent material.

Further in conjunction with the present exemplary configurations of FIGS. 6(a), 6(b) and 7, present exemplary circuit board 720 may have an outside diameter of about 130 mils while leads 722 and 724 are about 95 mils apart and leads 712 and 714 are about 66 leads apart, in the illustrated exemplary embodiments. Also, it will be understood by those of ordinary skill in the art that the side elevation view of FIG. 7 in fact only illustrates half of the leads that would be utilized in an actual embodiment.

Various dimensions, materials, and characteristics may be practiced in the foregoing exemplary embodiments, as understood by those of ordinary skill in the art, for use in particular embodiments, without departing from the spirit or scope of the present subject matter. In addition, all presently referenced dimensions, materials and characteristics are intended as exemplary values, within the broader aspects of the present subject matter, and not intended as limitations thereto.

While the present subject matter has been described in detail with respect to specific embodiments thereof, it will be appreciated that those skilled in the art, upon attaining an understanding of the foregoing may readily adapt the present technology for alterations or additions to, variations of, and/or equivalents to such embodiments. Accordingly, the scope of the present disclosure is by way of example rather than by way of limitation, and the subject disclosure does not preclude inclusion of such modifications, variations, and/or additions to the present subject matter as would be readily apparent to one of ordinary skill in the art.

What is claimed is:

1. A filtered feedthrough capacitor arrangement for use in a patient-implantable medical environment, comprising:
   a feedthrough capacitor having a main body and at least a first lead emerging from one side of said main body and a second lead emerging from another side of said main body;
   a feedthrough filter associated with at least one of said feedthrough capacitor leads; and
   an asymmetrical filter, associated with said at least one of said feedthrough capacitor leads, and electrically situated between said feedthough capacitor and said feedthrough filter, said asymmetrical filter including a low value resistance for providing differing forward and reverse characteristic responses of the filtered feedthrough capacitor arrangement.

2. A filtered feedthrough capacitor arrangement as in claim 1, wherein:
   said feedthrough capacitor first and second leads comprise respective sets of pluralities of leads; and
   said asymmetrical filter comprises a resistor mounting substrate, with a corresponding plurality of low value resistors supported thereon, and associated with one of the respective sets of plural leads of said feedthrough capacitor, each of said resistors having a respective value generally no greater than 50 Ohms.

3. A filtered feedthrough capacitor arrangement as in claim 2, wherein each of said resistors has a respective value generally in a range of from about 20 Ohms to about 15 Ohms.

4. A filtered feedthrough capacitor arrangement as in claim 2, wherein each of said resistors comprises a thick film resistor supported on said asymmetrical filter substrate, and respectively interconnecting with one of said feedthrough capacitor leads and a lead associated with said feedthrough filter.

5. A filtered feedthrough capacitor arrangement as in claim 1, wherein:
said feedthrough capacitor first and second leads comprise respective sets of pluralities of leads; and
said asymmetrical filter comprises a resistor mounting substrate comprised of ceramic material, and a corresponding plurality of low value, thick film resistors supported on said substrate, each of said resistors having a respective value generally in a range of from about 20 Ohms to about 15 Ohms.

6. A filtered feedthrough capacitor arrangement as in claim 1, wherein:
said feedthrough capacitor first and second leads comprise respective sets of pluralities of leads; and
said asymmetrical filter comprises a resistor mounting substrate comprised of ceramic material, and a corresponding plurality of low value, wire wound resistors supported on said substrate, each of said resistors having a respective value generally in a range of from about 20 Ohms to about 15 Ohms.

7. A filter circuit for use electrically interposed between a feedthrough capacitor and a feedthrough filter of the type having plural respective leads, and provided for use in association with implantable medical devices and other input and/or output filtering related environments, said filter circuit comprising:
a resistor mounting substrate; and
a plurality of predetermined small value resistors supported on said substrate and arranged for connection in series with input or output leads of a further device, collectively providing with an associated feedthrough capacitor and feedthrough filter an asymmetrical filtering arrangement capable of passing different energy levels in respective forward and reverse directions.

8. A filter circuit as in claim 7, wherein said resistor mounting substrate comprises a ceramic substrate, and said plurality of predetermined small value resistors respectively comprise thick film resistors each having a respective resistance value generally in a range of from about 20 Ohms to about 15 Ohms, such that at frequencies above about 2 MHz, the input response curve of the resulting asymmetrical filtering arrangement has a significantly higher insertion loss than the output response curve thereof.

9. A filter circuit as in claim 7, wherein said resistor mounting substrate comprises a ceramic substrate, and said filter circuit further includes a corresponding plurality of respective connection pin pairs coupled to said plurality of resistors.

10. A filter circuit as in claim 9, wherein said plurality of resistors respectively comprise wound wire resistors, and said connection pin pairs include conductive termination tubes respectively receiving the ends of said wound wire resistors.

11. A filter circuit as in claim 10, wherein:
each of said wound wire resistors comprise a plurality of turns of coated non-magnetic resistor wire, wound around a mandrel to produce a resistance value of about 15 ohms; and
said conductive termination tubes comprise Platinum/Rhodium tubes dimensioned for receipt of said ends of said wound wire resistors.

12. A filter circuit as in claim 11, wherein:
each of said wound wire resistors comprise about 42 turns of 3 mil coated non-magnetic nichrome resistor wire, wound around a 15 mil mandrel, so as to produce a resulting coil about 120 mils long;
said conductive termination tubes each have dimensions of about 12 mil outside diameters and 4 mil inside diameters; and
respective end portions of each of said wound wire resistors include gas tungsten arc welds thereon so as to form a hermetic and positive joint.

13. A filter circuit as in claim 7, wherein:
said resistor mounting substrate comprises a ceramic substrate; and
said plurality of predetermined small value resistors respectively comprise wound wire resistors;
said filter circuit further includes a plurality of connection fillets formed by said substrate, a corresponding plurality of respective connection pin pairs coupled to said fillets, and a corresponding plurality of lands interconnecting said fillets with respective ends of said wound wire resistors.

14. A filter circuit as in claim 13, wherein said respective connection pin pairs have predetermined thermal conductivity ratings and respective physical spacings, so as to avoid excessive heat transfer to said filter circuit.

15. A filter circuit as in claim 7, wherein said plurality of predetermined small value resistors respectively comprise thick film resistors.

16. A method for improving EMI and voltage transient protection for implantable medical devices, including providing differing forward and reverse characteristic responses thereof by inserting a predetermined low value resistance in series with biocompatible connecting leads of the implantable device, so that EMI input protection may be provided thereto without significantly reducing energy transfer from the protected implantable device.

17. A method as in claim 16, wherein the implantable medical device is heart related, and said inserting step includes inserting said predetermined low value resistance in series with heart connecting leads of such heart related device.

18. A method as in claim 16, wherein said predetermined low value resistance is generally less than 50 Ohms, and the protected implantable device includes a filter associated therewith, such that higher frequency energy is allowed out of an associated protected device than is allowed into such device, which provides for asymmetrical filtering, for attenuation of certain frequency ranges entering such associated filter while allowing output pulses to exit without distortion.

19. A method as in claim 16, wherein said predetermined low value resistance is generally no greater than 20 Ohms.

20. A method as in claim 16, wherein said predetermined low value resistance is generally in a range of from about 20 Ohms to about 15 Ohms.

21. A method as in claim 16, where said predetermined low value resistance comprises a plurality of resistors, respectively associated with a corresponding plurality of leads associated with an implantable medical device.

* * * * *